US007615133B2

(12) United States Patent
Tateno et al.

(10) Patent No.: US 7,615,133 B2
(45) Date of Patent: Nov. 10, 2009

(54) ELECTROSTATIC CHUCK MODULE AND COOLING SYSTEM

(75) Inventors: Noriaki Tateno, Fukuoka (JP); Jun Miyaji, Fukuoka (JP); Yasumi Sago, Tokyo (JP); Masayoshi Ikeda, Tokyo (JP); Kazuaki Kaneko, Tokyo (JP); Tomio Takamura, Yamaguchi (JP); Tadashi Hirayama, Yamaguchi (JP); Yoshiyuki Ikemura, Yamaguchi (JP); Masahiko Tamaru, Yamaguchi (JP)

(73) Assignees: Toto Ltd., Tokyo (JP); Canon Anelva Corporation, Tokyo (JP)

( * ) Notice: Subject to any disclaimer, the term of this patent is extended or adjusted under 35 U.S.C. 154(b) by 327 days.

(21) Appl. No.: 10/497,720

(22) PCT Filed: Dec. 3, 2002

(86) PCT No.: PCT/JP02/12658

§ 371 (c)(1),
(2), (4) Date: Jan. 31, 2005

(87) PCT Pub. No.: WO03/049180

PCT Pub. Date: Jun. 12, 2003

(65) Prior Publication Data

US 2005/0127619 A1 Jun. 16, 2005

(30) Foreign Application Priority Data

Dec. 4, 2001 (JP) ............................. 2001-369957

(51) Int. Cl.
  C23C 16/00 (2006.01)
  C23F 1/00 (2006.01)
  H01L 21/306 (2006.01)
  H01L 21/683 (2006.01)

(52) U.S. Cl. ............................ 156/345.53; 156/345.51; 156/345.52; 118/728; 361/234

(58) Field of Classification Search ................. 118/728; 156/345.51, 345.52, 345.53; 361/234
See application file for complete search history.

(56) References Cited

U.S. PATENT DOCUMENTS 4,260,432 A   4/1981   Plewes (Continued)

FOREIGN PATENT DOCUMENTS

JP   04-333265   11/1992

(Continued)

*Primary Examiner*—Parviz Hassanzadeh
*Assistant Examiner*—Rakesh K Dhingra
(74) *Attorney, Agent, or Firm*—Carrier, Blackman & Associates, P.C.; Joseph P. Carrier; William D. Blackman

(57) ABSTRACT

An electrostatic chuck module for a semiconductor manufacturing apparatus which can be cooled with water and in which there is no penetration leak includes an electrostatic chuck plate of alumina and a cooling plate which is bonded to the electrostatic chuck, wherein the cooling plate is formed by forging processing to a Cu-based composite material comprising Cu—W, Cu—W—Ni, Cu—Mo, or Cu—Mo—Ni. By adjusting the ratio of Cu and Ni having a great thermal expansion coefficient and W and Mo having a small thermal expansion coefficient in a Cu-based composite material, it is possible to obtain a highly thermally conductive material having the same thermal expansion coefficient as an alumina material for an electrostatic chuck. However, since such a composite material has a penetration leak, it cannot be used in a vacuum system. According to the present invention, by conducting forging processing, a penetration leak can be prevented. Also, corrosion resistance which is important for a cooling plate can be improved by applying a Ni, Cr or Cu film by plating or sputtering.

8 Claims, 4 Drawing Sheets

U.S. PATENT DOCUMENTS

| | | | |
|---|---|---|---|
| 4,587,594 A * | 5/1986 | McPherson | 361/690 |
| 4,620,432 A | 11/1986 | Stepanenko et al. | |
| 4,748,136 A * | 5/1988 | Mahulikar et al. | 501/32 |
| 5,042,257 A * | 8/1991 | Kendrick et al. | 62/3.1 |
| 5,644,467 A * | 7/1997 | Steger et al. | 361/234 |
| 5,675,471 A * | 10/1997 | Kotecki | 361/234 |
| 5,676,205 A * | 10/1997 | White | 165/275 |
| 5,688,331 A * | 11/1997 | Aruga et al. | 118/725 |
| 5,761,023 A * | 6/1998 | Lue et al. | 361/234 |
| 5,828,127 A | 10/1998 | Yamagata et al. | |
| 6,021,854 A * | 2/2000 | Scarola | 173/170 |
| 6,045,860 A | 4/2000 | Ito et al. | |
| 6,106,682 A * | 8/2000 | Moslehi et al. | 204/298.15 |
| 6,253,829 B1 * | 7/2001 | Mashiko et al. | 164/109 |
| 6,292,346 B1 * | 9/2001 | Ohno et al. | 361/234 |
| 6,414,834 B1 * | 7/2002 | Weldon et al. | 361/234 |
| 6,853,533 B2 * | 2/2005 | Parkhe | 361/234 |
| 2001/0009178 A1 * | 7/2001 | Tamura et al. | 156/345 |
| 2002/0017346 A1 * | 2/2002 | Osada et al. | 148/679 |
| 2002/0129475 A1 * | 9/2002 | Tsai et al. | 29/25.01 |
| 2002/0186967 A1 * | 12/2002 | Ramanan et al. | 392/418 |

FOREIGN PATENT DOCUMENTS

| | | |
|---|---|---|
| JP | 07-297265 | 11/1995 |
| JP | 08-125002 | 5/1996 |
| JP | 08-316299 | 11/1996 |
| JP | 09-055460 | 2/1997 |
| JP | 11-026564 | 1/1999 |
| JP | 2000-031253 | 1/2000 |
| JP | 2000-313905 | 11/2000 |
| JP | 2001-164304 | 6/2001 |
| JP | 2001-223261 | 8/2001 |

* cited by examiner

FIG. 1
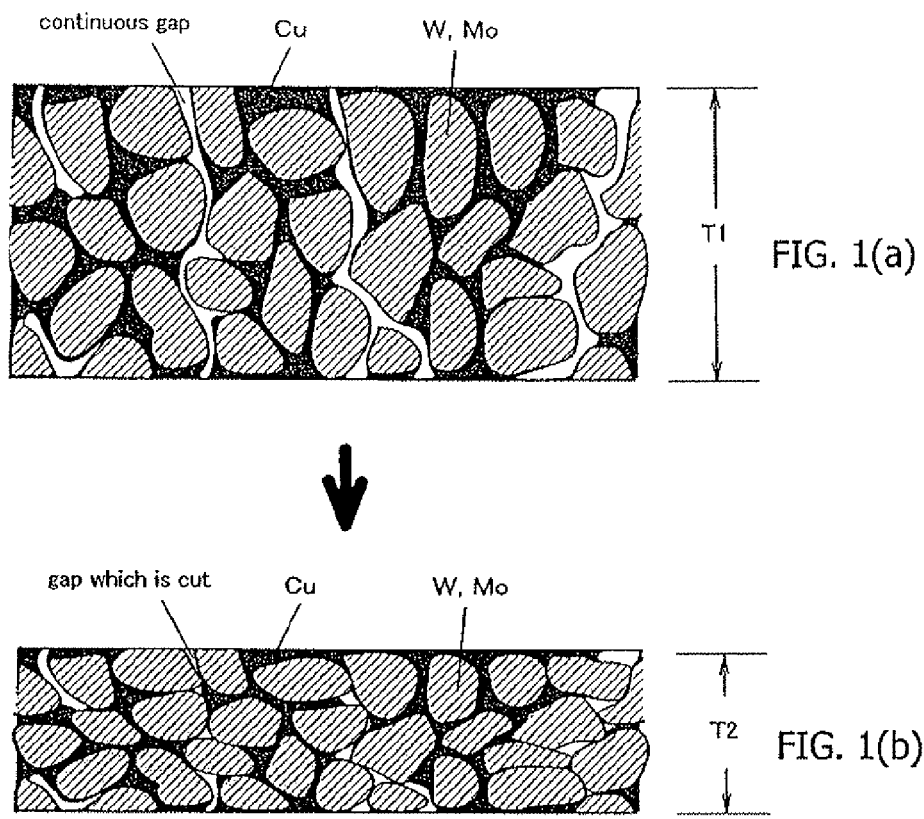
FIG. 1(a)
FIG. 1(b)
FIG. 2
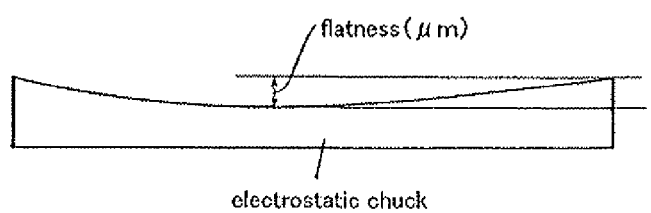

ELECTROSTATIC CHUCK MODULE AND COOLING SYSTEM

DESCRIPTION OF BACKGROUND ART

1. Field of the Invention

The present invention relates to a technique with respect to a ceramic electrostatic chuck for retaining a wafer which is used in plasma CVD, etcher, or the like in a semiconductor manufacturing apparatus, and particularly relates to an electrostatic chuck module in which water is used as a coolant.

2. Description of Background Art

In a semiconductor manufacturing apparatus for plasma CVD, etcher, or the like, high frequency is applied in a state where gas is flowed in a vacuum, so that reaction proceeds. In this instance, since a wafer attracted by an electrostatic chuck is subjected to heat, uniform processing cannot be conducted due to temperature variation of the wafer unless the wafer is cooled. Thus, the electrostatic chuck and a cooling plate have been bonded, and thereby cooling is conducted so as to keep the temperature of the wafer constant.

As the cooling plate for the electrostatic chuck module, aluminum has been used conventionally. In this case, Fluorinert (trademark name) or the like is used as a coolant. However, since Fluorinert has drawbacks of high cost and bad cooling efficiency, an attempt has been made to use water instead of Fluorinert. However, since aluminum has inferior corrosion resistance with respect to water, there is a possibility that a water passage will be clogged or a hole will be opened in the cooling plate due to corrosion. In order to solve these problems, Cu (copper, bronze, etc.) is considered preferable as the material of the cooling plate.

The material of the cooling plate requires high heat conductivity. A composite material including Cu is most suitable to meet this requirement. However, when a leakage test was conducted on a cooling plate which was made of Cu—W, Cu—W—Ni, Cu—Mo, and Cu—Mo—Ni, respectively, a penetration leak occurred in the material itself.

Although an electrostatic chuck has a main feature in that it can be used in a vacuum, it becomes impossible to use an electrostatic chuck in a vacuum in a case where a penetration leak occurs.

Also, since Cu has a different thermal expansion coefficient from ceramic, the surface flatness of the electrostatic chuck is unpreferably varied by temperature variation of the electrostatic chuck due to In (indium) bonding used as a method for bonding metal and ceramic. Incidentally, even in a case of using aluminum, the flatness is varied in the same way. This is because the thermal expansion coefficient is significantly different between alumina ceramic of the electrostatic chuck and metal such as aluminum or copper, and thereby In undergoes plastic deformation by temperature variation.

In particular, when the size of a wafer is as large as 12 inches, the problem of the flatness variation becomes more serious.

In addition, as for the Cu-based composite material, measures need to be taken to prevent corrosion with respect to water including galvanic corrosion which is caused by applying voltage.

SUMMARY OF THE INVENTION

In order to solve the problem of the penetration leak, according to the present invention, there is provided an electrostatic chuck module comprising an electrostatic chuck plate made of alumina, and a cooling plate which is bonded thereto, wherein the cooling plate is made by conducting forging processing to a Cu-based composite material including Cu—W, Cu—W—Ni, Cu—Mo, or Cu—Mo—Ni.

The reason why forging processing is effective in preventing a penetration leak defect is as follows:

Before forging, a small continuous gap is present in the boundary between the Cu portion and the W or Mo portion as shown in FIG. 1(a), and the gap causes a penetration leak. However, by forging processing, when the composite material is deformed by force in a certain direction, the continuous gap in the boundary is cut and becomes discontinuous as shown in FIG. 1(b).

In this regard, when an HIP process was conducted, since the material was compacted uniformly with respect to the longitudinal direction and the transverse direction, the continuous gap was left without being cut. As a result, a leak occurred.

Also, in order to completely eliminate the continuous gap by forging processing, it is necessary to conduct forging processing such that the theoretical density ratio is 97% or more and the forging ratio is 5% or more. The forging ratio refers to $100(T1-T2)/T1$ in the example of FIG. 1.

In order to reduce the variation of the flatness at the same time of controlling a leak, the difference in the thermal expansion coefficient between the cooling plate and the alumina electrostatic chuck plate is adjusted to be $2 \times 10^{-6}/°$ C. or less according to the present invention.

In addition, in order to improve the corrosion resistance, a thin film of Ni, Cu, Cr, Ti or Sn is formed on the surface of a water passage in the cooling plate by a plating method, a PVD method, a CVD method, or the like according to the present invention. Also, in the electrostatic chuck module according to the present invention, after the cooling plate and the alumina electrostatic chuck plate are bonded, fine processing is conducted to the surface of the electrostatic chuck plate until the flatness thereof becomes 5 μm or less.

The flatness refers to the difference between the highest point and the lowest point with respect to the surface of the electrostatic chuck plate.

Also, as a structure for preventing discharge and contamination, the outer periphery of the alumina electrostatic chuck plate is undercut, and the outer side surface of the cooling plate is covered with an alumina film, so that the alumina film is continuous with the undercut portion.

BRIEF DESCRIPTION OF THE DRAWINGS

FIG. 1(a) is a diagram showing the structure of a Cu-based composite material before forging, and FIG. 1(b) is a diagram showing the structure of the Cu-based composite material after forging;

FIG. 2 is a view explaining flatness;

DETAILED DESCRIPTION OF PRESENT EMBODIMENTS

Figure 3:
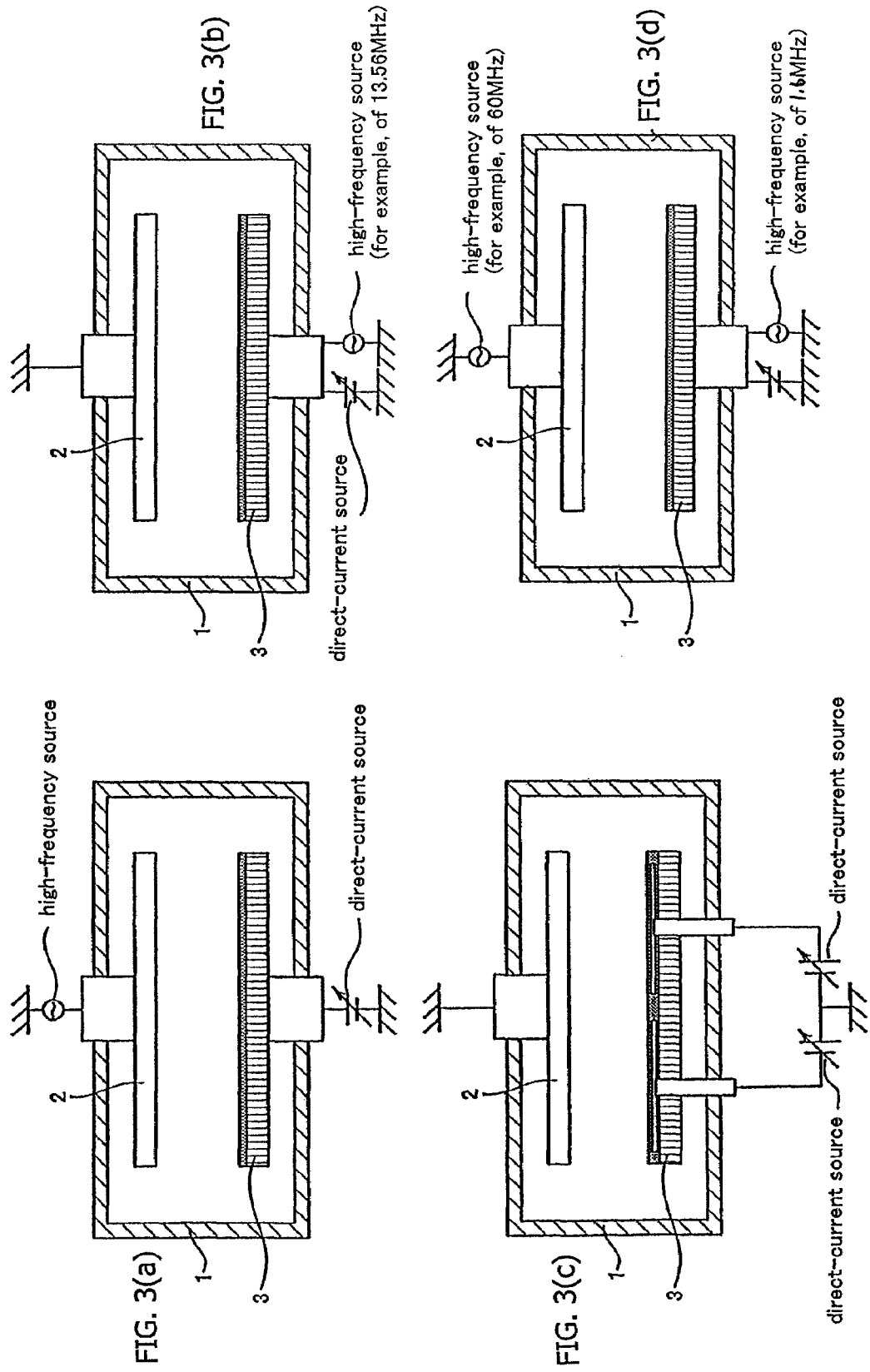
FIGS. 3(a)-(d) are cross-sectional views of plasma processing apparatuses in which an electrostatic chuck module according to the present invention is installed.
Figure 4:
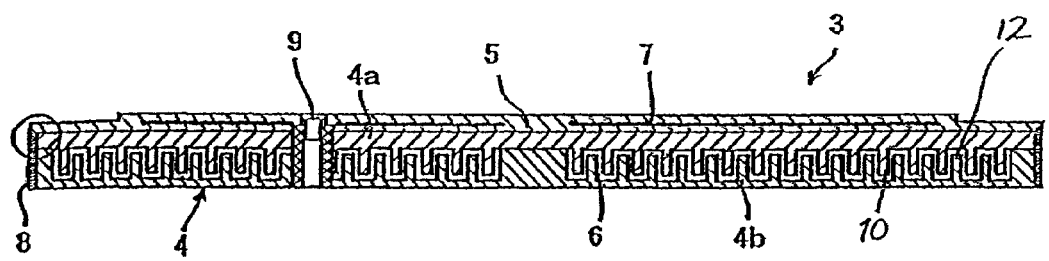
FIG. 4 is a cross-sectional view of the same electrostatic chuck module.
Figure 5:
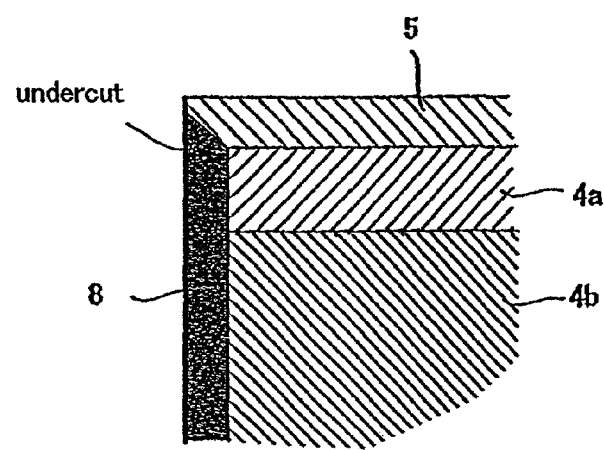
FIG. 5 is an enlarged view of a main part of the electrostatic chuck module as circled in FIG. 4.

Hereinafter, embodiments according to the present invention will be explained with reference to the attached drawings. FIGS. 3 (a)-(d) are a cross-sectional view of plasma processing apparatuses in which an electrostatic chuck module according to the present invention is installed, FIG. 4 is a cross-sectional view of the same electrostatic chuck module, and FIG. 5 is an enlarged view of the main part of FIG. 4.

In each of the plasma processing apparatuses shown in FIGS. 3(a)-(d), an upper electrode 2 is provided in the upper portion of a chamber 1, and an electrostatic chuck module 3 is provided in the lower portion of the chamber 1. The operation of each plasma processing apparatus is as follows:

In the plasma processing apparatus shown in FIG. 3(a), predetermined gas is introduced at a predetermined flow rate from a gas introducing section which is not shown in the drawing. The pressure of the chamber is controlled to be a predetermined pressure by a pressure controlling section which is not shown in the drawing. Plasma is generated by applying high frequency, for example, of 13.56 MHz to the upper electrode 2. Etching, film-forming, deposited film peeling, resist peeling or the like is conducted to a substrate mounted on the electrostatic chuck module 3 by using the generated plasma. In this instance, the substrate is attracted to the electrostatic chuck module 3 by applying direct-current voltage to a lower electrode. Although FIG. 3(a) shows a case where the electrostatic chuck is a monopolar type, a bipolar type is also possible.

In the plasma processing apparatus shown in FIG. 3(b), predetermined gas is introduced at a predetermined flow rate from a gas introducing section which is not shown in the drawing. The pressure of the chamber is controlled to be a predetermined pressure by a pressure controlling section which is not shown in the drawing. Plasma is generated by applying high frequency, for example, of 13.56 MHz to a lower electrode. Etching, film-forming, deposited film peeling, resist peeling or the like is conducted to a substrate mounted on the electrostatic chuck module 3 by using the generated plasma. In this instance, the substrate is attracted to the electrostatic chuck module 3 by applying direct-current voltage to the lower electrode. Although FIG. 3(b) shows a case where the electrostatic chuck is a monopolar type, a bipolar type is also possible.

In the plasma processing apparatus shown in FIG. 3(c), predetermined gas is introduced at a predetermined flow rate from a gas introducing section which is not shown in the drawing. The pressure of the chamber is controlled to be a predetermined pressure by a pressure controlling section which is not shown in the drawing. Reactive species are generated in a heating mechanism which is not shown in the drawing. Etching, film-forming, deposited film peeling, resist peeling or the like is conducted to a substrate mounted on the electrostatic chuck module 3 by using the generated reactive species. In this instance, the substrate is attracted to the electrostatic chuck module 3 by applying direct-current voltage to a lower electrode. FIG. 3(c) shows a case where the electrostatic chuck is a bipolar type, and this is not possible in a monopolar type.

In the plasma processing apparatus shown in FIG. 3(d), predetermined gas is introduced at a predetermined flow rate from a gas introducing section which is not shown in the drawing. The pressure of the chamber is controlled to be a predetermined pressure by a pressure controlling section which is not shown in the drawing. Plasma is generated by applying high frequency, for example, of 60 MHz to the upper electrode and 1.6 MHz to a lower electrode. Etching, film-forming, deposited film peeling, resist peeling or the like is conducted to a substrate mounted on the electrostatic chuck module 3 by using the generated plasma. In this instance, the substrate is attracted to the electrostatic chuck module 3 by applying direct-current voltage to the lower electrode. Although FIG. 3(d) shows a case where the electrostatic chuck is a monopolar type, a bipolar type is also possible.

FIGS. 3(a)-(d) show substrate processing apparatuses of a parallel-plate type. However, the present invention can be applied to a processing apparatus having another structure or mechanism as far as an electrostatic chuck is subjected to temperature variation in the apparatus.

As shown in FIG. 4 the electrostatic chuck module 3 is comprised of a cooling plate 4 which is made of a Cu-based composite material, and an electrostatic chuck plate 5 which is made of alumina, the cooling plate 4 and the electrostatic chuck plate 5 being bonded to each other. The cooling plate 4 is constructed by an upper half 4a and a lower half 4b, where the upper half 4a has a multiplicity of integral spaced-apart upper projections 12 extending downwardly thereon, and the lower half 4b has a multiplicity of integral spaced-apart lower projections 10 extending upwardly thereon, the upper and lower projections 10, 12 configured and arranged to intermesh with one another, while leaving some space therebetween, as shown. A cooling water (coolant) passage 6 is formed between the intermeshing upper and lower projections 10, 12 of the upper half 4a and the lower half 4b, in a state where the upper half 4a and the lower half 4b are bonded. An internal electrode 7 is provided in the electrostatic chuck 5. Incidentally, a single internal electrode 7 is provided in a case of a monopolar type, and a pair of internal electrodes 7 are provided in a case of a bipolar type.

Figure 6:
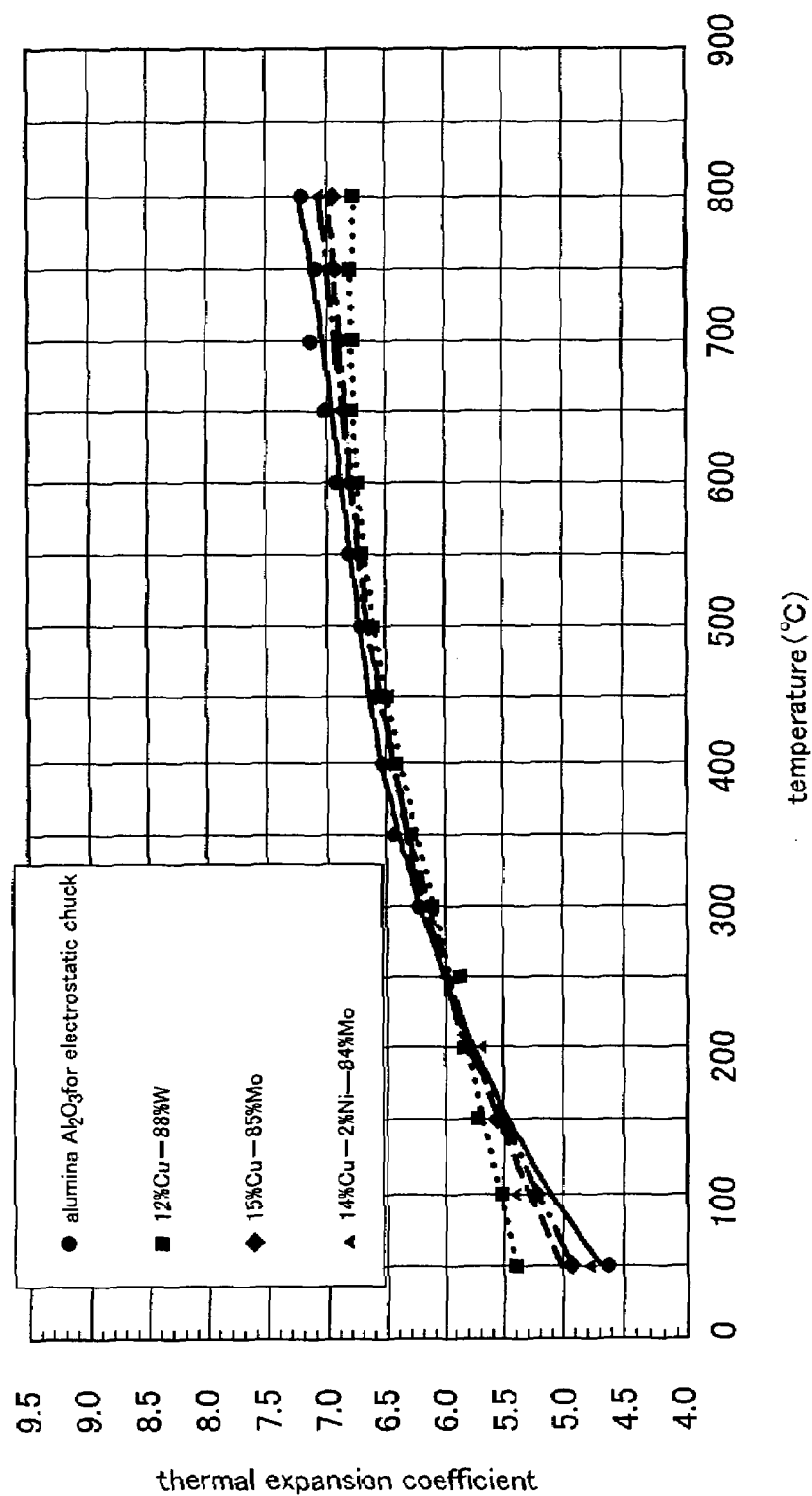
FIG. 6 is a graph comparing the thermal expansion coefficient between alumina and a Cu-based composite material.

In order to assemble the above-mentioned electrostatic chuck module 3, the electrostatic chuck plate 5, and the upper half 4a and the lower half 4b which construct the cooling plate 4 are prepared. A Cu-based composite material is used as the material for the upper half 4a and the lower half 4b. FIG. 6 is a graph comparing the thermal expansion coefficient between alumina and a Cu-based composite material. Examples of the Cu-based composite material are 12% Cu-88% W, 15% Cu-8% Mo, 14% Cu-2% Ni-84% Mo. Among these, 14% Cu-2% Ni-84% Mo is most suitable because the thermal expansion coefficient thereof is closest to that of alumina.

Forging processing of 5% or more is conducted to the upper half 4a and the lower half 4b, so that there is substantially no continuous gap in the crystalline boundary. In each of these examples, the upper and lower portions are made by forging a 100% metal composite comprising at least one metal selected from a group consisting of Cu, Ni, Mo, and W.

A thin film of Ni, Cu, Cr, Ti or Sn is formed to the surfaces of the upper half 4a and the lower half 4b, which are on the side of forming the passage 6, by a plating method, a PVD method, a CVD method or the like. Next, the upper half 4a and the lower half 4b are bonded to each other by soldering or brazing so as to produce the cooling plate 4.

Next, the cooling plate 4 and the electrostatic chuck plate 5 are metalized, and thereafter, In bonding, soldering or silver brazing is conducted (in a case of silver brazing, it is possible to bond a Cu-based composite material and a Cu-based composite material and an electrostatic chuck at the same time). After bonding, fine processing is conducted to the surface of the electrostatic chuck plate 5 until the flatness thereof becomes 5 μm or less, and the outer periphery of the cooling plate 4 and the electrostatic chuck plate 5 are processed. The outer periphery of the electrostatic chuck plate 5 is undercut, and an alumina thin film 8 is formed on the outer side surface of the cooling plate 4 by thermal spraying so as to obtain an insulation property. Reference number 9 refers to a sleeve into which a lift pin is inserted.

Hereinafter, examples will be described in detail.

EXAMPLE 1

After a composite material of 15% Cu-85% Mo, and a composite material of 15% Cu-85% Mo (each of which was baked and underwent forging processing of 40%) were processed into a metal plate respectively, electroless Ni plating, sintering, and electrolytic Ni plating were conducted, vacuum brazing was conducted with BAg8, and thereby a cooling plate was produced.

An electrostatic chuck made of alumina and the cooling plate made of a composite material were metalized by a PVD method, and bonded by soldering.

Next, fine processing was conducted to the surface of the electrostatic chuck until the flatness thereof became 5 μm or less. The outer periphery of the electrostatic chuck was undercut, alumina having a purity of 99% was sprayed by thermal spraying, an $SiO_2$ film was impregnated, and the outer periphery of the electrostatic chuck and the sprayed film were ground simultaneously.

EXAMPLE 2

An alloy of 13.5% Cu-2.0% Ni-84.5% Mo and an alloy of 13.5% Cu2.0% Ni-84.5% Mo (each of which underwent forging processing of 20%) were prepared, and a Ti film was formed on the surface of each alloy by a PVD method. These alloys and an electrostatic chuck made of alumina were bonded by vacuum brazing with BAg8 (silver solder was provided between both Cu-based materials, and between the Cu-based material and the metalized electrostatic chuck, and simultaneous bonding was conducted). Next, fine processing was conducted to the surface of the electrostatic chuck until the flatness thereof became 5 μm or less. The outer periphery of the electrostatic chuck was undercut, alumina having a purity of 99% was sprayed by thermal spraying, and the outer periphery of the electrostatic chuck and the sprayed film were ground simultaneously.

EXAMPLE 3

An alloy of 14.5% Cu-1.0% Ni-84.5% Mo, and an alloy of 14.5% Cu-1.0% Ni-84.5% Mo (each of which underwent forging processing of 40%) were prepared, an Sn film was formed on each alloy by a PVD method, and soldering was conducted, so as to produce a cooling plate. An Sn film was also formed on an electrostatic chuck by a PVD method, and soldering was conducted to bond the electrostatic chuck and the cooling plate. Next, fine processing was conducted to the surface of the electrostatic chuck until the flatness thereof became 5 μm or less. The outer periphery of the electrostatic chuck was undercut, alumina having a purity of 99% was sprayed by thermal spraying, an $SiO_2$ film was impregnated, and the outer periphery of the electrostatic chuck and the sprayed film were ground simultaneously.

COMPARATIVE EXAMPLE

Two sheets of aluminum metal plates were bonded by aluminum brazing so as to produce a cooling plate. Almite processing was conducted to form an aluminum insulation film. Ti and Cu were sputtered to the bonding surface of the aluminum cooling plate and an electrostatic chuck, and In bonding was conducted. Next, fine processing was conducted to the surface of the electrostatic chuck.

Tests were conducted with respect to Examples 1-3 and the Comparative example under predetermined heat cycle conditions, and the flatness after the tests are shown in Table 1. As shown in Table 1, the flatness can be controlled to be 5 μm or less if a Cu-based composite material is used as a cooling plate. In contrast, a flatness of 10 μm or less cannot be achieved if an aluminum metal plate is used. In addition, temperature variation deteriorates the flatness by 30 μm.

TABLE 1

| | | | Evaluation results | | |
|---|---|---|---|---|---|
| No. | Test piece | Heat cycle conditions | Flatness before test | Flatness after test | sprayed film peeling |
| 1 | Example 1 | Room temperature → 120° C. 5 hours → Room temperature for 50 cycles Air atmosphere | 3 μm | 1 μm | None |
| 2 | Example 1 | Room temperature → 80° C. 5 hours → Room temperature for 100 cycles Air atmosphere | 1 μm | 2 μm | None |
| 3 | Example 2 | Room temperature → 120° C. 5 hours → Room temperature for 50 cycles Air atmosphere | 4 μm | 5 μm | None |
| 4 | Example 3 | Room temperature → 120° C. 5 hours → Room temperature for 100 cycles Air atmosphere | 2 μm | 4 μm | None |
| Comp. example | Comp. example | Room temperature → 120° C. 5 hours → Room temperature for 50 cycles Air atmosphere | 20 μm | 50 μm | — |

Table 2 shows the results of the leakage amount in a case where the relative density and the forging ratio were varied. It can be seen from Comparative example 6 that the leakage amount was great in the case where the relative density was low as 95% even if the forging ratio was increased. On the other hand, it can be seen from Comparative examples 5 and 7 that the leakage amount was also great in the case where the forging ratio was low even if the relative density was increased.

Examples 1-6 show that the relative density of 97% or more and the forging ratio of 5% or more need to be satisfied at the same time in order to reduce the leakage amount to the order of $10^{-9}$.

TABLE 2

| Test piece | | Relative density | Forging ratio | Leakage amount (Pa · m³/sec) | Evaluation results | Remarks |
|---|---|---|---|---|---|---|
| Comp. Example | ① 12% Cu-88% W | 96% | 0 | $1.0 * 10^{-7}$ or more | NG | |
| | ② 10% Cu-3% Ni-87% W | 96% | 0 | $4.3 * 10^{-7}$ or more | NG | |
| | ③ 14% Cu-86% W | 98.7% | 0 | $2.0 * 10^{-8}$ or more | NG | |
| | ④ 10% Cu-3% Ni-85% Mo | 95% | 0 | $7.8 * 10^{-7}$ or more | NG | |
| | ⑤ 10% Cu-3% Ni-87% W | 99.2% | 0 | $8.3 * 10^{-8}$ or more | NG | HIP process (Relative density before HIP: 96%) |
| | ⑥ 12% Cu-88% W | 95% | 30% | $6.2 * 10^{-7}$ or more | NG | |
| | ⑦ 12% Cu-3% Ni-85% Mo | 99% | 3% | $5.0 * 10^{-8}$ or more | NG | |
| Present Invention | ① 12% Cu-88% W | 99% | 20% | $5.4 * 10^{-10}$ or less | OK | |
| | ② 10% Cu-3% Ni-87% W | 99.3% | 30% | $2.0 * 10^{-9}$ or less | OK | |
| | ③ 12% Cu-3% Ni-85% Mo | 97.0% | 10% | $7.5 * 10^{-9}$ or less | OK | |
| | ④ 15% Cu-85% Mo | 99.9% | 50% | $1.0 * 10^{-10}$ or less | OK | |
| | ⑤ 10% Cu-3% Ni-85% Mo | 98.3% | 5% | $7.5 * 10^{-9}$ or less | OK | |
| | ⑥ 10% Cu-3% Ni-85% Mo | 99.8% | 40% | $2.1 * 10^{-9}$ or less | OK | |

Forging ratio = (Thickness before forging − Thickness after forging)/Thickness before forging * 100
Test method: Hood test
Benchmark: $1.0 * 10^{-8}$ or less (Pa · m³/sec)

INDUSTRIAL APPLICABILITY

As is fully explained in the above, according to the present invention, since a forged Cu-based composite material is used as the material for the cooling plate, it is possible to provide the electrostatic chuck module in which the cooling effect is high, the change of the surface flatness is small, corrosion does not occur even after a pure water passing test, and a penetration leak does not occur.

Although the present embodiments of the invention are described in detail above, it will be understood by persons skilled in the art that variations and modifications may be made thereto without departing from the spirit or essence of the invention.

What is claimed is:

1. An electrostatic chuck module comprising:
   an electrostatic chuck plate;
   a cooling plate bonded to the electrostatic chuck plate comprising a body formed by bonding an upper portion to a lower portion, wherein each of said upper and lower portions is made by forging a 100% metal composite comprising at least one metal material selected from a group consisting of Cu—W, Cu—W—Ni, Cu—Mo, and Cu—Mo—Ni;
   a plurality of projections in a space between the upper portion and the lower portion; and
   a coolant filling in the space;
   wherein the forging of each of the upper and lower portions is conducted such that a theoretical density ratio is 97% or more and a forging ratio is 5% or more; and
   wherein said electrostatic chuck module has a leakage amount of $\leq 7.5 \times 10^{-9}$ (Pa·m³/sec) as determined by HOOD TEST.

2. The electrostatic chuck module according to claim 1, wherein a content of Cu in the upper portion is 15% or less, and a content of Cu in the lower portion is 15% or less.

3. The electrostatic chuck module according to claim 1, wherein the upper and lower portions are formed of a same metal composite.

4. The electrostatic chuck module according to claim 1, wherein the forging of each of the upper and lower portions consist of 14% Cu, 2% Ni, and 84% Mo.

5. A plasma processing apparatus comprising:
   a chamber having a plasma generating device;
   an electrostatic chuck module;
   wherein the electrostatic chuck module comprises an electrostatic chuck plate, a cooling plate bonded to the electrostatic chuck plate comprising a body formed by bonding an upper portion to a lower portion, wherein each of said upper and lower portions is made by forging a 100% metal composite comprising at least one metal material selected from a group consisting of Cu—W, Cu—W—Ni, Cu—Mo, and Cu—Mo—Ni, a plurality of projections in a space between the upper portion and the lower portion, and a coolant filling in the space;

wherein the forging of each of the upper and lower portions is conducted such that a theoretical density ratio is 97% or more and a forging ratio is 5% or more; and wherein said electrostatic chuck module has a leakage amount of $\leqq 7.5 \times 10^{-9}$ (Pa·m$^3$/sec) as determined by HOOD TEST.

6. The plasma processing apparatus according to claim 5, wherein a content of Cu in the upper portion is 15% or less, and a content of Cu in the lower portion is 15% or less.

7. The plasma processing apparatus according to claim 5, wherein the upper and lower portions are formed of a same metal composite.

8. The plasma processing apparatus according to claim 5, wherein the forging of each of the upper and lower portions consist of 14% Cu, 2% Ni, and 84% Mo.

* * * * *